(12) United States Patent
Du et al.

(10) Patent No.: US 6,198,289 B1
(45) Date of Patent: Mar. 6, 2001

(54) SYSTEM FOR OPERATING MR GRADIENT COIL TO PRODUCE PULSES OF DIFFERENT AMPLITUDES AND SLEW-RATES

(75) Inventors: Yiping Du, Towson, MD (US); Kevin F. King, New Berlin, WI (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 09/207,458

(22) Filed: Dec. 8, 1998

(51) Int. Cl.[7] .................................................. G01V 3/00
(52) U.S. Cl. ............................................ 324/322; 324/307
(58) Field of Search .................................... 324/322, 307, 324/300, 309

(56) References Cited

U.S. PATENT DOCUMENTS

| | | | | |
|---|---|---|---|---|
| 5,492,123 | * | 2/1996 | Edelman | 324/322 |
| 5,663,647 | * | 9/1997 | Wirth et al. | 324/322 |

* cited by examiner

Primary Examiner—Christine Oda
Assistant Examiner—Brij B. Shrivastav
(74) Attorney, Agent, or Firm—James O. Skarsten; Christian G. Cabou; Phyllis Y. Price

(57) ABSTRACT

In an MR imaging system, a method is provided for operating an MR gradient coil to provide a pulse sequence which comprises first and second sub-sequences. During the first sub-sequence, the coil is operated to produce a pair of diffusion-weighted imaging pulses, each having a gradient amplitude and a slew-rate. During the second sub-sequence the coil is operated to produce a train of echo-planar imaging pulses, each having a gradient amplitude which is selectively less than the amplitude of the diffusion-weighted pulses, and a slew-rate which is selectively greater than the slew-rate of the diffusion-weighted pulses. Thus, the invention is directed to a gradient system which can provide optimal performance for both diffusion-weighted imaging and echo-planar imaging, while using only a single coil for a given gradient axis. At the same time, the system enables gradient performance parameters to be selected so as to ensure that constraints imposed by the Reilly curve will not be exceeded, and to thereby avoid peripheral nerve stimulation.

18 Claims, 4 Drawing Sheets

SYSTEM FOR OPERATING MR GRADIENT COIL TO PRODUCE PULSES OF DIFFERENT AMPLITUDES AND SLEW-RATES

BACKGROUND OF THE INVENTION

The invention disclosed and claimed herein is generally directed to a system for driving an MR gradient coil, so that the coil is operated in two or more different modes to produce pulses of selectively different gradient amplitudes and slew-rates during a single MR pulse sequence. More particularly, the invention pertains to a system wherein the gradient coil is operated in a given mode to produce gradient pulses having any gradient amplitude and any slew-rate up to a maximum gradient amplitude and maximum slew-rate, respectively, which correspond to the given mode. A preferred application of the gradient system of the invention is diffussion-weighted echo-planar imaging.

Persons of skill in the art have now recognized that an MR imaging sequence which combines diffusion-weighted (DW) imaging and echo-planar imaging (EPI) can serve as an effective clinical tool for the early diagnosis of acute stroke. As is well known, a DW imaging sequence is sensitive to particle motion resulting from diffusion, and comprises two successive gradient pulses of comparatively long time duration. Diffusion sensitivity is characterized by a parameter referred to as b-value which depends quadratically on DW gradient pulse amplitude. Because of the long time duration of the DW pulses, slew-rate, which is a measure of the increment of gradient amplitude in a unit time, is not of primary importance. However, it has been determined that use of a maximum gradient amplitude for the DW gradient waveform results in a shorter echo time (TE), for a given b-value, and therefore provides a higher signal-to-noise ratio (SNR). In one wholebody MR scanner, for example, TE can be reduced from about 99 msec to 72 msec when the amplitude of the DW gradient waveform is increased from 22 mT/m to 40 mT/m, for a b-value of 1100 sec/mm$^2$. Such reduction in TE results in a considerable increase in SNR for brain tissue. Moreover, reduced TE decreases repetition time, and therefore increases volume coverage for the same imaging time. Alternatively, higher gradient amplitude allows a higher b-value with greater attendant diffusion sensitivity for a given TE. Using a higher gradient amplitude also makes DW trace imaging more feasible.

In EPI, a series of bipolar trapezoidal gradient pulses is used for data acquisition. It is very desirable to provide a high slew-rate, for successive pulses of the series, to reduce the spacing therebetween. In the readout of a combined DW-EPI sequence, a reduced spacing results in smaller off-resonance effects, such as image distortion and blurring. Moreover, it is anticipated that a substantial increase in slew-rate, over the currently used slew-rate of 120 T/m/sec, could provide these benefits in single shot EPI, which is the imaging method of choice for DW imaging.

From the above, it would appear that significant increases in both gradient amplitude and slew-rate would be very desirable in a combined DW-EPI sequence. However, simultaneously increasing both parameters could cause peripheral nerve stimulation and be in violation of FDA regulations. As is well known by those of skill in the art, the Reilly curve defines the limits of gradient amplitude and slew rate which are likely to result in nerve stimulation. If the values selected for the amplitude and slew-rate of a particular gradient pulse collectively exceed limits established by the Reilly curve, undesirable peripheral nerve stimulation could occur. Also, systems currently available in the prior art to provide two slew-rates generally require two different coils for each gradient axis. It would be very desirable, both for simplicity and to reduce the cost of gradient amplifiers, to provide a system which could operate a single gradient coil to produce pulses of different combinations of maximum gradient amplitudes and slew-rates.

SUMMARY OF THE INVENTION

The present invention is directed to a new gradient system, which is disposed to operate a single gradient coil in multiple modes. The system is capable of operating the coil to provide gradient pulses having multiple combinations of maximum gradient amplitudes and maximum slew rates. That is, each mode of operation has a corresponding maximum gradient amplitude and maximum slew-rate. When operated in a given mode, the gradient system can produce pulses of any gradient amplitude, up to the corresponding maximum amplitude, and of any slew-rate, up to the corresponding maximum slew-rate. Accordingly, the gradient system can provide optimal gradient performance for both diffusion-weighted imaging and echo-planar imaging. At the same time, performance parameters are employed which ensure that limits established by the Reilly curve, including a selected safety factor, are not exceeded. In one useful embodiment, the invention comprises a dual slew-rate gradient system, which is capable of operating the same gradient coil to selectively produce pulses of two different maximum slew-rates, and of two different maximum amplitudes.

Generally, the invention can be embodied as a method for operating an MR gradient coil during a specified imaging sequence. Such method comprises the steps of driving the coil in a first mode, during a first sub-sequence, to produce a number of first gradient pulses in which the gradient amplitudes are equal to or lower than a first maximum gradient amplitude and the slew-rates are equal to or lower than a first maximum slew-rate, and driving the coil in a second mode, during a second sub-sequence, to produce a number of second gradient pulses, in which the gradient amplitudes and slew-rates are equal to or lower than a second maximum gradient amplitude and second maximum slew-rate. In general, the operating modes can be in any order. In a preferred embodiment, the coil is operated during the first sub-sequence to produce a set of diffusion-weighted imaging pulses, and is operated during the second sub-sequence to produce a train of EPI pulses.

In a further embodiment, the invention is directed to a gradient amplifier or other apparatus for driving a single MR gradient coil in multiple modes of operation. The amplifier is operable in a first mode disposed to drive the coil to produce a number of first gradient pulses, each having an amplitude and slew-rate which do not exceed a first maximum gradient amplitude and a first maximum slew-rate, respectively, and operable in a second mode to drive the coil to produce a number of second gradient pulses, each having an amplitude and a slew-rate which do not exceed a second maximum gradient amplitude and a second maximum slew-rate, respectively. The second maximum gradient amplitude is selectively less than the first maximum gradient amplitude, and the second maximum slew-rate is selectively greater than the first maximum slew-rate. The apparatus further comprises a switch disposed to switch the gradient amplifier from one of the modes to the other, during a single brief time period. In a preferred embodiment, the amplifier is operable in the first mode to drive the gradient coil to produce a set of diffusion-weighted imaging pulses, and is operable in the second mode to dive the coil to produce a train of echo planar imaging pulses.

DETAILED DESCRIPTION OF THE PREFERRED EMBODIMENT

Figure 1:
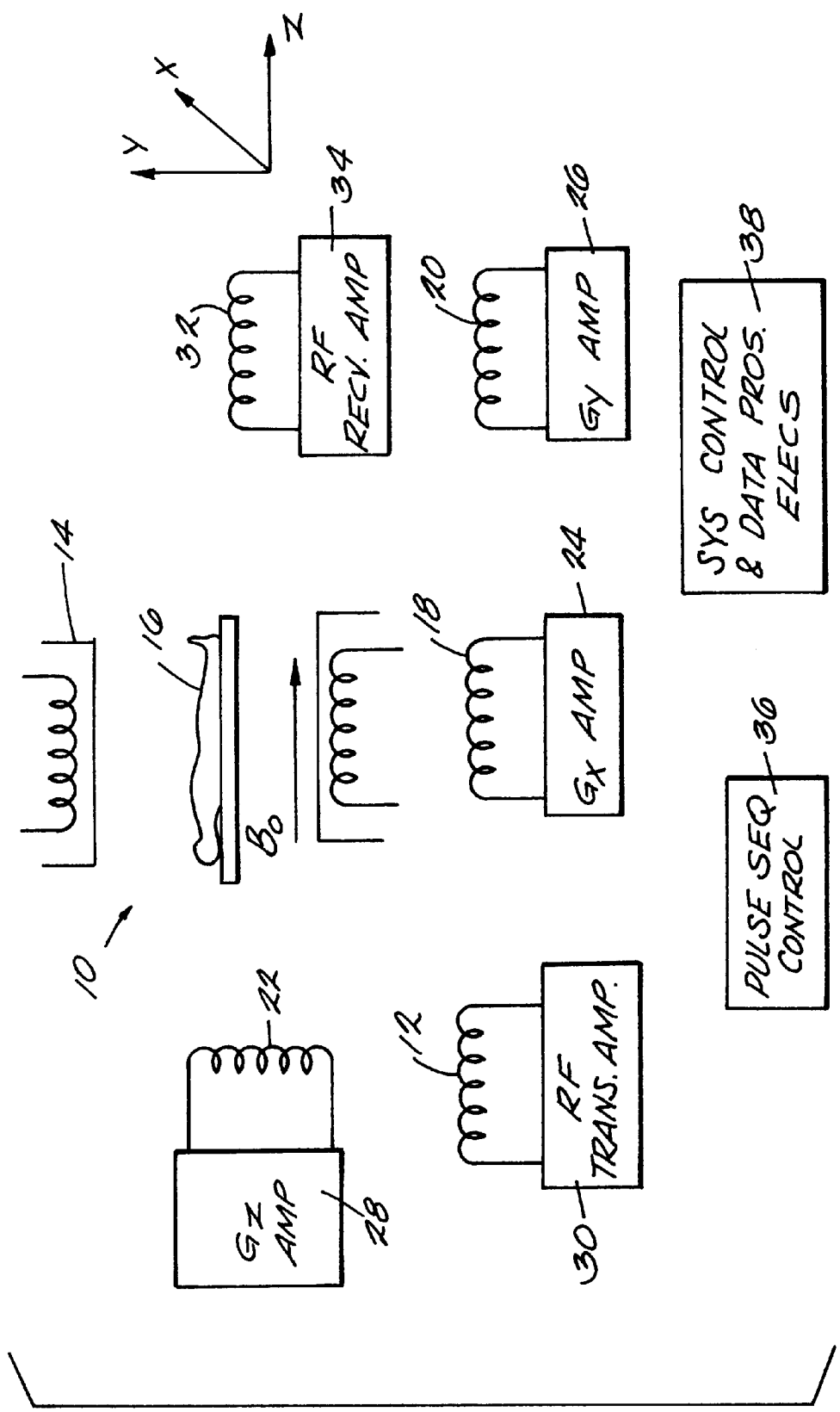
FIG. 1 is a schematic diagram showing basic components of an MR system for use in practicing embodiments of the invention.

Referring to FIG. 1, there are shown the basic components of an MR system or scanner 10 which may be operated in accordance with the invention described herein. System 10 includes an RF transmit coil 12, as well as a cylindrical magnet 14 for generating a main or static magnetic field $B_o$ in the bore thereof. RF coil 12 is operated to transmit RF excitation signals into a patient or other subject of imaging 16 residing in the magnet bore, in order to produce MR signals. System 10 further includes gradient coils 18, 20 and 22 for generating $G_x$, $G_y$ and $G_z$ magnetic field gradients relative to orthogonal X-, Y- and Z-reference axes, respectively. FIG. 1 shows each of the gradient coils 18, 20 and 22 respectively driven by gradient amplifiers 24, 26 and 28, and RF coil 12 driven by transmit amplifier 30. FIG. 1 further shows an RF coil 32, which is operated in association with a receive amplifier 34 to acquire MR signals from subject 16. In some arrangements, coil 32 and coil 12 comprise the same RF coil, which is operated in alternate modes during the imaging sequence. System 10 is further provided with a pulse sequence control 36, which is operated to control the RF and gradient amplifiers, and to thereby generate pulse sequences to produce and acquire sets of MR signals. System 10 also includes system control and data processing electronics 38, for operating respective components of system 10 in accordance with the invention. The construction, functions, and interrelationships of components of MR system 10 are well known and described in the prior art, such as in U.S. Pat. No. 5,673,969, issued Sep. 30, 1997 to Zhou et al.

Figure 2:
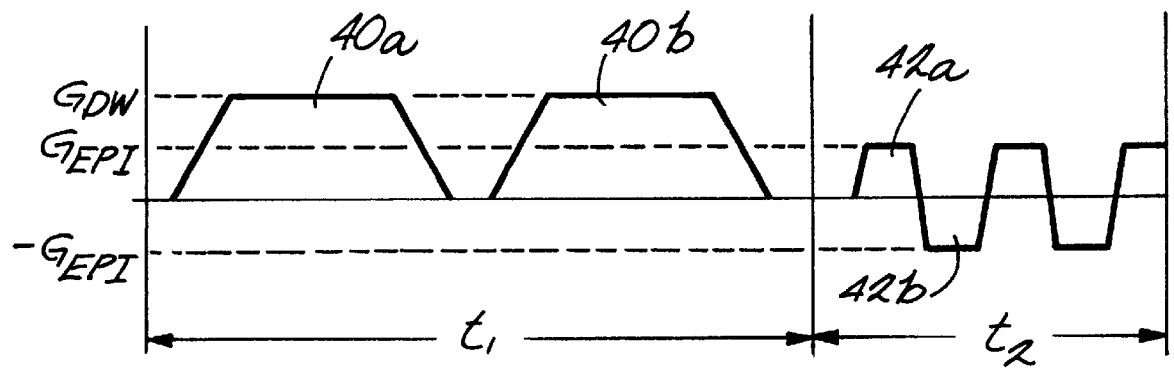
FIG. 2 is a diagram showing a pulse sequence comprising a combination of DW and EPI gradient pulses, which may be produced in accordance with an embodiment of the invention.

Referring to FIG. 2, there is shown a gradient pulse sequence, which comprises two sub-sequences occurring during time periods $t_1$ and $t_2$, respectively. The gradient pulses of the two sub-sequences may be produced by operating one of the gradient amplifiers of MR system 10, such as $G_x$ amplifier 24, to selectively drive its corresponding gradient coil 18.

FIG. 2 further shows the sub-sequence of time period ti comprising a pair of DW imaging pulses 40a and 40b, each having an amplitude $G_{DW}$. As stated above, it is very desirable to increase the amplitude of the DW pulses, to reduce TE for a given b-value and to thereby enhance SNR.

Referring further to FIG. 2, the sub-sequence of time period $t_2$ is shown to comprise a train of bipolar EPI gradient pulses, such as pulses 42a and 42b. Positive EPI pulses have a gradient amplitude $G_{EPI}$, and negative EPI pulses have a gradient amplitude $-G_{EPI}$. As stated above, increasing the slew-rate in a train of EPI gradient pulses, to decrease the spacing therebetween reduces off-resonance and eddy current effects such as image distortion and blurring, thereby improving single shot EPI images. Reducing eddy-current related distortion is particularly important in DW imaging because such distortion is a serious obstacle for combining DW images with different b-values, and in DW trace imaging. As previously stated, the sequence of FIG. 2 may provide a valuable tool for the early diagnosis of acute stroke.

As described above, the Reilly curve pertains to peripheral nerve stimulation in patients of MR imaging. Such effect can result from excessively rapid change in a gradient magnetic field, and is related to both gradient amplitude and slew-rate. As is well known, the derivative dB/dt provides a measure of the peripheral nerve stimulation threshold, where B(t) represents magnetic field strength as a function of time. More specifically, the dB/dt threshold of peripheral nerve stimulation caused by a ramping gradient and corresponding to the Reilly curve, represented herein as dB/dt Reilly, can be expressed as follows:

$$dB/dt|_{Reilly} = \alpha(1+\oplus/\theta\tau) \qquad \text{Eqn. (1)}$$

In Equation (1), $\alpha=54$ T/sec, $\beta=132$ msec, $\tau$ is the duration of the gradient ramp when the gradient is switched from 0 to an amplitude G, and $\theta\tau$ is the total duration of the gradient ramp. From the above definition of $\tau$ and $\theta\tau$, it is seen that $\theta=1$ when a gradient is switched from 0 to G, and $\theta=2$ when a gradient is switched from $-G$ to G (e.g., for adjacent bipolar pulses). In a simplified model, dB/dt is related to slew-rate SR by:

$$dB/dt = L \cdot SR \qquad \text{Eqn. (2)}$$

In Equation (2) L is a scaling factor which depends on gradient coil usefully chosen for a preferred gradient coil embodiment to be 0.344 m, and slew-rate is given by the expression $SR=G/\tau$.

In a clinical setting, the maximum allowed value of dB/dt (i.e., $dB/dt|_{actual}$) must be lower than the peripheral nerve stimulation threshold by a safety factor $f_s$, in order to avoid any possibility of peripheral nerve stimulation, that is:

$$dB/dt|_{actual} \leq f_s \cdot dB/dt|_{Reilly} \qquad \text{Eqn. (3)}$$

As stated above, safety factor $f_s$ usefully is 66% of the Reilly curve. From Equations (1)–(3), the relationship between gradient amplitude and slew-rate becomes:

$$1+\beta \cdot SR/\theta G \geq L \cdot SR/(f_s \cdot \alpha). \qquad \text{Eqn. (4)}$$

Using $\theta=2$, $\alpha=54$ T/sec, $\beta=132$ 82 sec, L=0.344 m, and $f_s=0.66$, Equation (4) can be rewritten as follows:

$$1+66(\mu sec)\cdot 10^3 SR(T/m/sec)/G(mT/m) \geq SR(T/m/sec)/103.6(T/m/sec) \qquad \text{Eqn. (5)}$$

Figure 3:
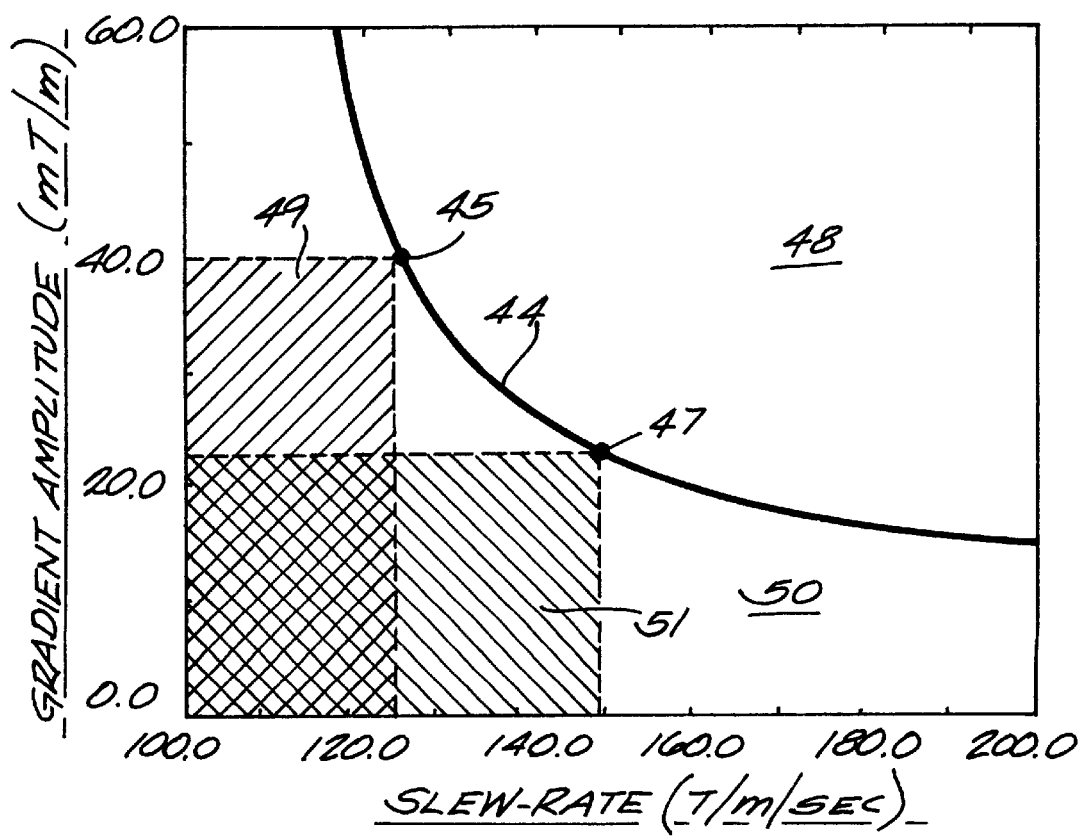
FIG. 3 shows a Reilly curve comprising a plot of gradient amplitude versus slew-rate which is likely to result in peripheral nerve stimulation in a preferred embodiment.

Referring to FIG. 3, there is shown a Reilly curve 44 generated by plotting gradient amplitude versus slew-rate, for the condition where peripheral nerve stimulation results. More specifically, Reilly curve 44 is a plot of Equation (5). Thus, a gradient pulse characterized by a point on the graph of FIG. 3 which lies in the region 48, i.e., above Reilly curve 44, is likely to cause peripheral nerve stimulation in a patient. On the other hand, a gradient pulse characterized by a point lying in the region 50, i.e., below curve 44 is unlikely to cause peripheral nerve stimulation.

Referring further to FIG. 3, there is shown a rectangular area 49, which represents the range of allowed gradient amplitudes, as well as the range of allowed slew-rates, for a first operating mode of an embodiment of the invention. Such range is bounded by a maximum amplitude of 40 mT/m, and a maximum slew-rate of 125 T/m/sec. Such maximum values intersect curve 44 at a point 45. There is also shown a rectangular area 51, which represents the range of allowed gradient amplitudes, as well as the range of allowed slew-rates, for a second operating mode of an embodiment of the invention. Such range is bounded by a maximum amplitude of 22.1 mT/m, and a maximum slew-rate of 150 T/m/sec. Such maximum values intersect curve 44 at a point 47.

Referring again to FIG. 2, if the amplitude $G_{DW}$ of pulses 40a and 40b is to be increased, in order to realize the benefits described above in connection with DW imaging, Equation (5) may be employed to determine the maximum allowable slew-rate for the DW pulses 40a and 40b. For example, one study has suggested that a gradient amplitude of 40 mT/m could provide considerable improvement in image quality and clinical value for the DWI sequence. At the same time, a slew-rate of 77 T/m/sec was found to be sufficient for the DW gradient waveform. From Equation (5), the maximum allowed slew-rate for a peak gradient amplitude of 40 mT/m is found to be 125 T/m/sec. It will be readily apparent that a slew-rate of 77 T/m/sec is well below such allowed maximum.

In like manner, another study has shown that an increase of slew-rate above the currently used rate of 120 T/m/sec will be beneficial to single shot EPI. At the same time, it has been found that for the EPI readout waveform, a gradient amplitude of 22 mT/m is found to be sufficient for a commonly used field-of-view. In a preferred embodiment, if slew-rate is selected to be 150 T/m/sec, the maximum allowed gradient amplitude is found from Equation (5) to be 22.1 mT/m.

Figure 4A:
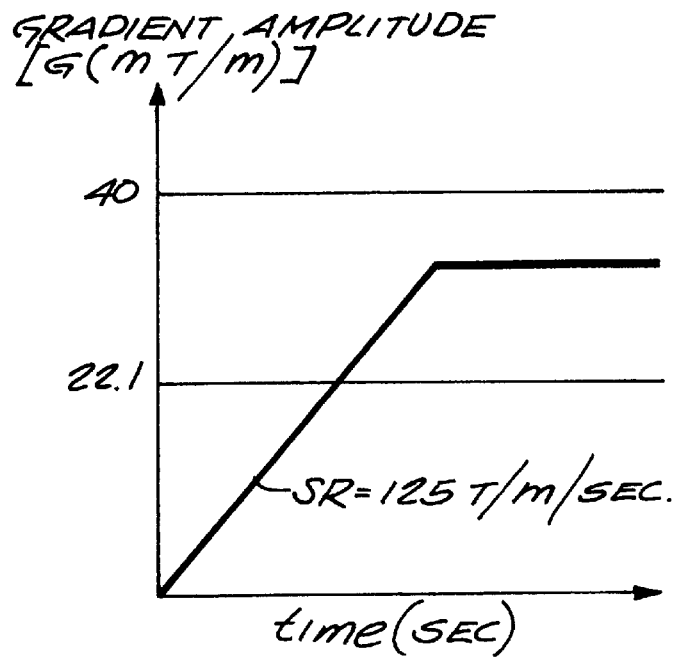
FIG. 4A is a graph showing gradient amplitude versus slew-rate for a first operational mode of a gradient system operated in accordance with the invention.
Figure 4B:
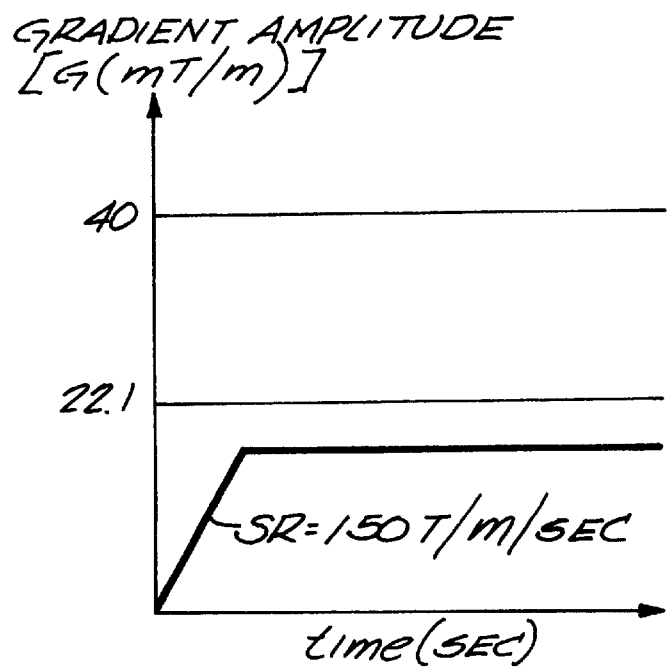
FIG. 4B is a graph showing gradient amplitude versus slew-rate for a second operational mode of a gradient system operated in accordance with the invention.

In accordance with the invention, it has been recognized that if a two-mode gradient system is provided to drive a gradient coil, the coil can produce pulses having optimal parameter values for DWI and EPI, respectively. More particularly, a two-mode gradient system provides a reduced gradient slew-rate when the peak gradient amplitude is higher than a specified value, and provides a higher gradient slew-rate when the peak gradient amplitude is lower than the specified value. At the same time, from the relationship given by Equation (5), respective parameter values can be set for both DWI and EPI pulses which are within the constraints described above in connection with the Reilly curve. The performance of a two-mode gradient system, comprising an embodiment of the invention, is depicted in FIGS. 4A and 4B, collectively, for the specific values computed above. FIG. 4A shows a slew-rate of 125 T/m/sec used when the peak gradient amplitude of a pulse is between 22.1 mT/m and 40 mT/m in a preferred embodiment. FIG. 4B shows a slew-rate of 150 T/m/sec used when the peak gradient amplitude of a pulse is below 22.1 mT/m in the same preferred embodiment.

Figure 5A:
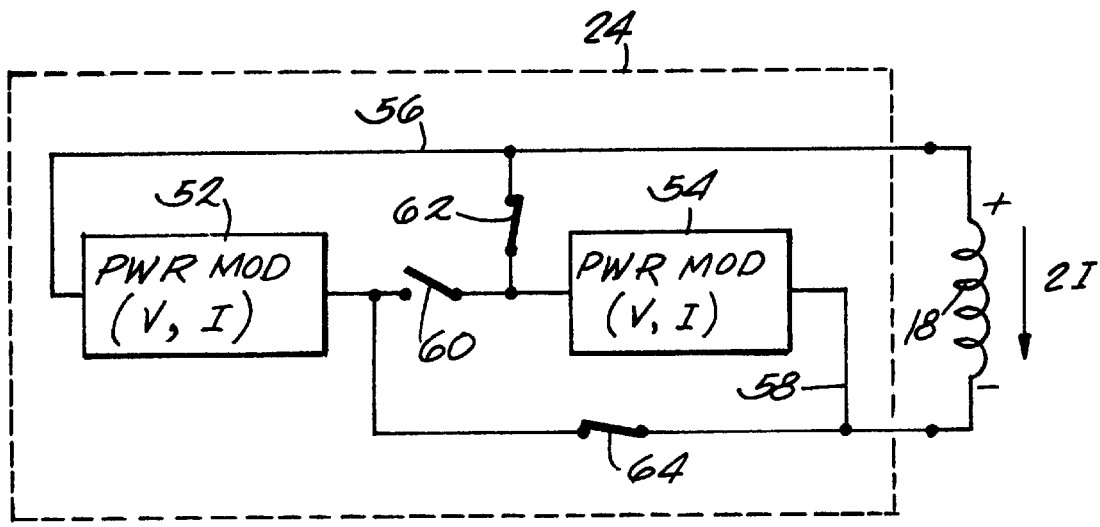
FIGS. 5A and 5B are schematic views respectively showing a gradient amplifier for an embodiment of the invention in two modes of operation.
Figure 5B:
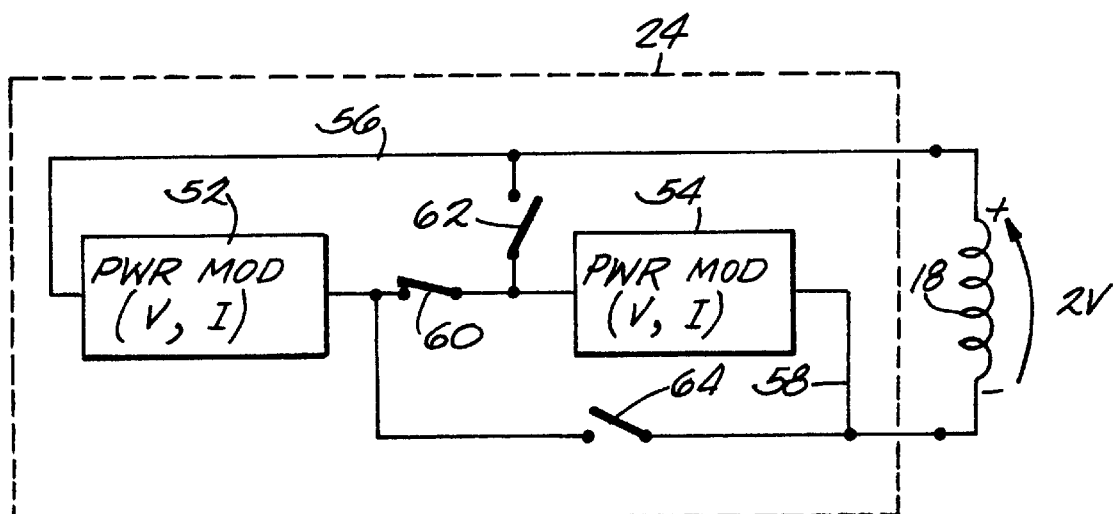

Referring to FIGS. 5A and 5B, there is shown a very useful and comparatively simple configuration for implementing an embodiment of the invention. More specifically, there is shown gradient amplifier 24 comprising power modules 52 and 54, each providing a voltage V and a current I. The two power modules are interconnected in part through conductive paths 56 and 58, to supply power to gradient coil 18. Power modules 52 and 54 are also selectively interconnected by means of switch components 60, 62 and 64.

FIG. 5A shows switch 60 open and switches 62 and 64 closed. This has the effect of connecting power modules 52 and 54 in parallel. Accordingly, the current supplied to gradient coil 18 is the sum of the current generated by the two power modules, that is, 2I, but the voltage applied to gradient coil 18 is V. The increased current has the effect of driving coil 18 to produce pulses of double the gradient amplitude, but with the same slew-rate compared to the amplitude and slew-rate produced by a single power module.

FIG. 5B shows switch 60 closed and switches 62 and 64 open. This has the effect of connecting power modules 52 and 54 in series. Accordingly, the voltage applied to gradient coil 18 is the sum of the voltages generated by the two power supplies, that is, 2V but with current I. The increased voltage has the effect of driving coil 18 to produce pulses of double the slew-rate, but with the same amplitude as produced by a single power module.

It will be readily apparent that the switching of the two power modules, between the parallel and series modes, must be fast enough, such as on the order of 1 msec, that they can be switched from one mode to the other between waveforms 40b and 42a in FIG. 2 of the DW-EPI pulse sequence. This may be achieved, for example, by means of a programmable circuit residing in MR system control 38, and connected to operate switch components 60, 62 and 64.

It is to be emphasized that in a modification of the invention, a gradient system may be provided which is operable in more than two modes to drive a specified gradient coil. For a particular mode, the coil is driven to produce gradient pulses of any selected amplitude and any slew-rate, up to a specified maximum gradient amplitude and maximum slew-rate, respectively, which correspond to the particular operational mode. Also, the order in which different operating modes occur during an imaging sequence is entirely arbitrary.

It is to be emphasized further that the gradient system of the invention can be readily employed to produce other pulse sequences, which will readily occur to those of skill in the art, in addition to the diffusion weighted-EPI pulse sequence described above.

Obviously, many other modifications and variations of the present invention are possible in light of the above teachings. It is therefore to be understood that within the scope of the disclosed concept, the invention may be practiced otherwise than as has been specifically described.

What is claimed is:

1. In an MR imaging system, a method for operating an MR gradient coil during a specified imaging sequence comprising first and second sub-sequences, said method comprising the steps of:

driving said coil during said first sub-sequence to produce a number of first gradient pulses, each of said first gradient pulses having a first gradient amplitude and a first slew-rate which are equal to or less than a maximum first gradient amplitude and a maximum first slew-rate, respectively; and driving said coil during said second sub-sequence to produce a number of second gradient pulses, each of said second gradient pulses having a second gradient amplitude which is selectively different from said first amplitude, and a second slew-rate which is selectively different from said first slew rate, said second gradient amplitude and said second slew rate being equal to or less than a maximum second gradient amplitude and a maximum second slew-rate, respectively.

2. The method of claim 1 wherein:

said coil is operated during said first sub-sequence to produce a pair of diffusion-weighted imaging pulses; and said coil is operated during said second sub-sequence to produce a train of echo-planar imaging pulses.

3. The method of claim 1 wherein:

said second maximum gradient amplitude pulses is selectively less than said first maximum gradient amplitude, and said second maximum slew-rate is selectively greater than said first maximum slew-rate.

4. In an MR imaging system, apparatus for producing gradient pulses of varying amplitude and slew rate comprising:

a gradient coil;

a gradient amplifier coupled to said coil, said amplifier being operable in a first mode to drive said coil to produce a number of first gradient pulses, each having a gradient amplitude selected from a range of amplitudes which is limited by a first maximum gradient amplitude, and slew rate selected from a range of slew-rates which is limited by a first maximum slew-rate, said amplifier being operable in a second mode to drive said coil to produce a number of second gradient pulses, each having a gradient amplitude selected from a range of amplitudes which is limited by a second maximum gradient amplitude, and a slew rate selected from a range of slew-rates which is limited by a second maximum slew-rate; and a switching device disposed to switch said amplifier from one of said modes to the other during a specified brief time period.

5. The apparatus of claim 4 wherein:

said second maximum gradient amplitude pulses is selectively less than said first maximum gradient amplitude , and said second maximum slew-rate is selectively greater than said first maximum slew-rate.

6. The apparatus of claim 5 wherein:

said gradient amplifier is operable in said first mode to drive said gradient coil to produce a set of pulses for a diffusion-weighted imaging procedure, and is operable in said second mode to drive said gradient coil to produce a train of echo planar imaging pulses.

7. The apparatus of claim 6 wherein:

said gradient amplifier and said switching device collectively operate said coil to produce said diffusion-weighted pulses and said echo-planar pulses during a single MR image sequence.

8. The apparatus of claim 5 wherein:

said gradient amplifier comprises first and second power modules, each providing a specified current and a specified voltage; and said switching device comprises a set of switches which collectively operate in said first mode to connect said first and second power modules in parallel to said coil, and operate in said second mode to connect said first and second power modules in series to said coil.

9. The apparatus of claim 5 wherein:

said first gradient amplitude is selected in relation to said first slew-rate, and said second gradient amplitude is selected in relation to said second slew-rate, respectively, to avoid peripheral nerve stimulation in a subject of MR imaging which is disposed to receive said first and second gradient pulses.

10. The apparatus of claim 5 wherein:

said first and second maximum gradient amplitudes are selected in relation to said first and second maximum slew-rates, respectively, so that the mathematical expression $1+C_1(SR)/G \geq (SR)/C_2$ is satisfied when G comprises said first maximum gradient amplitude and (SR) comprises said first maximum slew-rate, and also when G comprises said second maximum gradient amplitude and (SR) comprises said second maximum slew-rate, $C_1$ is a constant determined by the Reilly curve, and $C_2$ is a constant determined by the Reilly curve, safety factor and the configuration of the gradient coil.

11. In an MR imaging system, apparatus for producing gradient pulses of varying amplitude and slew rate comprising:

a specified gradient coil;

means operable in a first mode for driving said specified coil to produce a number of first gradient pulses, each having an amplitude and slew rate which do not exceed a first maximum gradient amplitude and a first maximum slew-rate, respectively, and operable in a second mode for driving said specified coil to produce a number of second gradient pulses, each having an amplitude and slew-rate which do not exceed a second maximum gradient amplitude and a second maximum slew-rate, respectively, said second maximum gradient amplitude being selectively less than said first maximum gradient amplitude, and said second maximum slew rate being selectively greater than said first maximum slew rate; and means for switching said coil driving means from one of its operable modes to the other during a specified brief time period.

12. The apparatus of claim 11 wherein:

said first gradient pulses comprise a set of pulses for a diffusion-weighted imaging procedure, and said second gradient pulses comprise a train of echo planar imaging pulses.

13. The apparatus of claim 12 wherein:

said coil driving means and said switching means collectively operate said specified coil to produce said diffusion-weighted pulses and said echo-planar pulses during a single MR image sequence.

14. The apparatus of claim 11 wherein:

said first and second maximum gradient amplitudes are selected in relation to said first and second maximum slew-rates, respectively, so that the mathematical expression $1+C_1(SR)/G \geq (SR)/C_2$ is satisfied when G comprises said first maximum gradient amplitude and (SR) comprises said first maximum slew-rate, and also when G comprises said second maximum gradient amplitude and (SR) comprises said second maximum slew-rate, $C_1$ is a constant determined by the Reilly curve, and $C_2$ is a constant determined by the Reilly curve, safety factor and the configuration of the gradient coil.

15. The apparatus of claim 11 wherein:

said coil driving means comprises a plurality of selectively interconnected power modules.

16. The apparatus of claim 15 wherein:

said switching means comprises a plurality of switches for selectively interconnecting said power modules and said specified coil to establish each of said operable modes.

17. The apparatus of claim 11 wherein:

said coil driving means is operable in a specified number of modes, in addition to said first and second modes, to drive said specified coil to produce gradient pulses, each of said additional modes having a corresponding maximum gradient amplitude and slew rate.

18. The apparatus of claim 11 wherein:

said coil driving means is operable in one of the multiple modes.

\* \* \* \* \*